United States Patent [19]

Tseng

[11] Patent Number: 5,759,891

[45] Date of Patent: Jun. 2, 1998

[54] INCREASED SURFACE AREA CAPACITOR VIA USE OF A NOVEL REACTIVE ION ETCH PROCEDURE

[75] Inventor: Horng-Huei Tseng, Hsinchu, Taiwan

[73] Assignee: Vanguard International Semiconductor Corporation, Hsin-Chu, Taiwan

[21] Appl. No.: 814,135

[22] Filed: Mar. 10, 1997

[51] Int. Cl.⁶ .............................................. H01L 21/8242
[52] U.S. Cl. ............................................ 438/253; 438/255
[58] Field of Search ................................ 438/238–255, 438/381–398

[56] References Cited

U.S. PATENT DOCUMENTS

| | | | |
|---|---|---|---|
| 5,254,503 | 10/1993 | Kenney | 437/228 |
| 5,427,974 | 6/1995 | Lur et al. | |
| 5,464,791 | 11/1995 | Hirota | 437/60 |
| 5,492,848 | 2/1996 | Lur et al. | 437/52 |
| 5,512,768 | 4/1996 | Lur et al. | 257/309 |

OTHER PUBLICATIONS

Watanabe et al., "Hemispherical Grain Silicon for High Density DRAMs", Solid State Technology, Jul., 1992, pp. 29–33.

Primary Examiner—Jey Tsai
Attorney, Agent, or Firm—George O. Saile; Stephen B. Ackerman

[57] ABSTRACT

A method of creating an STC structure, used for high density, DRAM designs, has been developed. The process consists of creating a saw-toothed topography for the top surface of a polysilicon storage node electrode. The saw-toothed topography is obtained by placing intrinsic HSG polysilicon spots on an underlying doped polysilicon layer. An anisotropic RIE procedure, using $SF_6$, as an etchant, removes doped polysilicon at a faster rate then the removal rate of the masking intrinsic HSG polysilicon spots, resulting in a saw-toothed topography in the polysilicon storage node electrode, comprised of raised features of HSG polysilicon spots, on unetched doped polysilicon, and lower features of etched, doped polysilicon. The saw-toothed topography, increases the surface area of the polysilicon storage node electrode, thus furnishing capacitance increases.

19 Claims, 3 Drawing Sheets

INCREASED SURFACE AREA CAPACITOR VIA USE OF A NOVEL REACTIVE ION ETCH PROCEDURE

BACKGROUND OF THE INVENTION

1. Field of the Invention

The present invention relates to a method used to fabricate high density, semiconductor, DRAM cells, and more specifically to a process used to increase the surface area, and the accompanying capacitance of an STC component of the DRAM cell, via the use of a storage node electrode configuration, obtained via a novel semiconductor processing sequence.

2. Description of the Prior Art

The semiconductor industry is continually striving to improve device performance, while still focusing on methods of reducing manufacturing costs. These objectives have been successfully addressed by the ability of the semiconductor industry to produce chips with sub-micron features, or microminiaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 16 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Watanabe, et al, in "Hemispherical Grain Silicon for High Density DRAMS", appearing in Solid State Technology, July, 1992, pages 29–33, describes a process for increasing the surface area of a storage node electrode by forming a continuous layer of hemispherical grain, (HSG), silicon on an underlying polysilicon structure, used for DRAM capacitors. The Watanabe, et al process, although resulting in increased surface area, has the level of increased surface area limited by the height, or roughness of the HSG grains, which can be difficult to control and reproduce. Another process for increasing the surface area of a storage node electrode, via the use of an HSG process is shown by C. Y. Lu, in an invention disclosure, VIS85-111, (serial No. 08-734061, filed Oct. 18, 1996). This invention, also describes the use of HSG, but in this case discontinuous spots of HSG are used as a mask to transfer the small diameter feature of the HSG spots, to an underlying silicon oxide layer. The small diameter features, now in the form of silicon oxide spots, are then used as a mask to allow etching of an underlying polysilicon layer, exposed between silicon oxide spots, to occur, resulting in a top surface of polysilicon exhibiting increased surface area. This method allows the level of surface area increases to be controlled by the depth of etching into the underlying polysilicon layer, used for the storage node electrode. This invention, although resulting in increased storage node surface areas, is complex, involving transferring the HSG spot feature to an underlying insulator, and then using the insulator spots as a mask for creating the storage node topography.

This invention will describe a simplified process for increasing the surface area of a polysilicon storage node electrode, by creating a top surface topography, exhibiting a saw-toothed design, comprised of a pattern of raised and lowered features in the polysilicon storage node. This saw-toothed topography is obtained via a simplified process of transferring the feature of small diameter hemi-spherical grained, (HSG), polysilicon spots, directly to an underlying polysilicon layer, to be used for the storage node electrode of a DRAM device. In this invention the small diameter HSG polysilicon spots, are deposited intrinsically on an underlying doped polysilicon layer. An anisotropic reactive ion etching, (RIE), procedure, using a specific RIE ambient, results in a greater removal rate of doped polysilicon, then of intrinsic polysilicon, thus allowing the desired level of etching of the doped polysilicon layer, exposed between intrinsic HSG polysilicon spots, to be realized, using intrinsic HSG polysilicon spots as a mask. This invention simplifies the Lu invention, in which an intermediate transfer layer, of small diameter insulator spots, was needed for the formation of an underlying polysilicon layer, with increased topography.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to deposit a discontinuous layer of intrinsic polysilicon, comprised of small diameter HSG polysilicon spots, on an underlying doped polysilicon layer.

It is yet another object of this invention to use the small diameter, intrinsic HSG polysilicon spots, as a mask to create a saw-toothed topography, in the top surface of an underlying doped polysilicon layer, comprised of raised and lower features in the doped polysilicon layer, and used for the polysilicon storage node electrode, of a DRAM device.

It is still another object of this invention to use a RIE process and ambient, that selectively removes doped polysilicon at a faster rate then intrinsic polysilicon, so that a thin, discontinuous layer of intrinsic, small diameter HSG polysilicon spots, can be used as a mask to create a topography in the underlying doped polysilicon layer, comprised of deeply etched features in the doped polysilicon, and raised features of doped polysilicon, with the unetched raised features, overlaid with remaining, masking, HSG polysilicon spots, not totally consumed in the RIE procedure.

In accordance with the present invention a method for fabricating increased capacitance DRAM devices, via use of an STC structure, comprised of a polysilicon storage node electrode with increased surface area, has been developed. A transfer gate transistor comprised of: a thin gate insulator; a polysilicon gate structure, formed from a first polysilicon layer; lightly doped source and drain regions; insulator spacers on the sidewalls of the polysilicon gate structure; and heavily doped source and drain regions; are formed on a semiconductor substrate. A composite insulator layer, comprised of a thin underlying silicon oxide layer, and a thick, overlying, doped oxide layer, is deposited, planarized, then followed by a contact hole opening in the composite insulator layer, made to expose the source and drain regions of adjacent transfer gate transistors. A second polysilicon layer is deposited, heavily doped via use of in situ doping procedures, completely filling the contact hole opening, and contacting the source and drain regions of the transfer gate transistor. The second polysilicon layer also overlies the composite insulator layer, in regions outside the contact hole opening. Thin, small diameter spots of intrinsic HSG polysilicon are next deposited on the underlying, heavily doped, second polysilicon layer. An anisotropic reactive ion etch procedure is used to etch the heavily doped, second polysilicon layer, exposed between the masking thin, small diameter spots, of intrinsic HSG polysilicon, creating a saw-toothed topography in the top surface of the underlying, heavily doped, second polysilicon layer, with the saw-toothed topography comprised of unetched, raised features of heavily doped, second polysilicon, overlaid with remaining, unetched HSG polysilicon spots, and lower features of etched, heavily doped, second polysilicon. Photolithographic and dry etching procedures, are then used to create the bottom electrode, or polysilicon storage node electrode shape, in the second polysilicon layer. A capacitor dielectric layer is next formed on the polysilicon storage node electrode structure, followed by the creation of an upper polysilicon electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a polysilicon storage node electrode, with increased surface area resulting from a saw-toothed topography, will now be described. The transfer gate transistor, used for this DRAM device, in this invention, will be an N channel device. However the STC structure, with the increased surface area described in this invention, can also be applied to P channel, transfer gate transistor.

Figure 1:
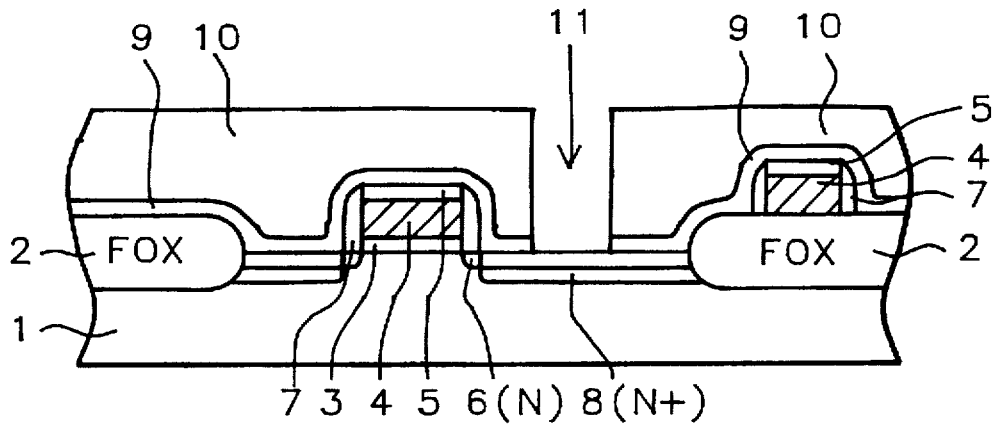
FIGS. 1–5, which schematically shows, in cross-sectional style, the key fabrication stages used in the creation of a DRAM device, with a STC structure, with an increased surface area, resulting from a polysilicon storage node electrode structure, featuring a saw-toothed topography.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using $CHF_3$ as an etchant for silicon oxide layer, 5, and using $Cl_2$ as an etchant for polysilicon layer, 4, are used to create polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using $CHF_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E14 to 5E16 atoms/cm$^2$. The result of these procedures are schematically shown in FIG. 1.

A third insulator layer of undoped silicon oxide, 9, is next deposited using LPCVD or PECVD procedures, at a temperature between about 700° to 800° C., to a thickness between about 1000 to 1500 Angstroms. A layer of doped silicon oxide, 10, either boro-phosphosilicate glass, (BPSG), or phosphosilicate glass, (PSG), is next deposited, using PECVD procedures, at a temperature between about 700° to 800° C., to a thickness between about 3000 to 8000 Angstroms, using tetraethylorthosilicate, (TEOS) as a source with the addition of either diborane and phosphine, for the BPSG layer, or the addition of only phosphine, for the PSG layer. (A single insulator layer can be substituted for insulator layer 9, and insulator layer 10, if desired). Doped oxide layer, 10, is planarized using chemical mechanical polishing, to provide a smoother surface for subsequent depositions and patterning procedures. The result of these depositions and planarization procedures are again schematically shown in FIG. 1. Conventional photolithographic and RIE procedures, using $CHF_3$ as an etchant, are used to open contact hole, 11, in doped silicon oxide layer 10, and in silicon oxide layer, 9, exposing the top surface of heavily doped source and drain region, 8, again shown schematically in FIG. 1. Photoresist removal is performed via use of plasma oxygen ashing and careful wet cleans.

Figure 2:
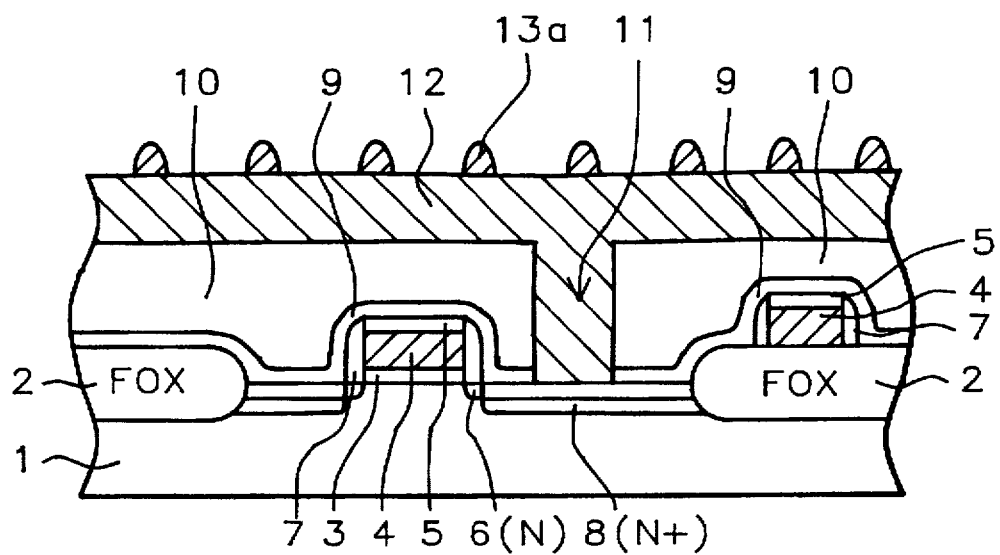

A second layer of polysilicon layer, 12, is next deposited, via LPCVD procedures, at a temperature between about 500° to 700° C., to a thickness between about 4000 to 8000 Angstroms. Polysilicon layer, 12, can be deposited intrinsically and doped via ion implantation of either phosphorous or arsenic, or polysilicon layer, 12, can be deposited using in situ doping procedures, via the addition of either phosphine or arsine, to a silane ambient. For both doping procedures polysilicon layer, 12, has an N type doping concentration of between 1E20 to 1E21 atoms/cm$^3$. Polysilicon layer, 12, shown schematically in FIG. 2, completely fills contact hole, 11, contacting underlying heavily doped source and drain regions, 8, of the underlying transfer gate transistor. A critical deposition of intrinsic, hemi-spherical grained, (HSG), polysilicon, 13a, is next deposited at a temperature between about 500° to 700° C., to a thickness in which the intrinsic HSG polysilicon is discontinuous, resulting in intrinsic HSG polysilicon spots, 13a, between about 100 to 1000 Angstroms in thickness, with a diameter between about 50 to 500 Angstroms, and with a space between intrinsic HSG polysilicon spots, 13a, between about 100 to 1000 Angstroms. This is schematically shown in FIG. 2.

Figure 3:
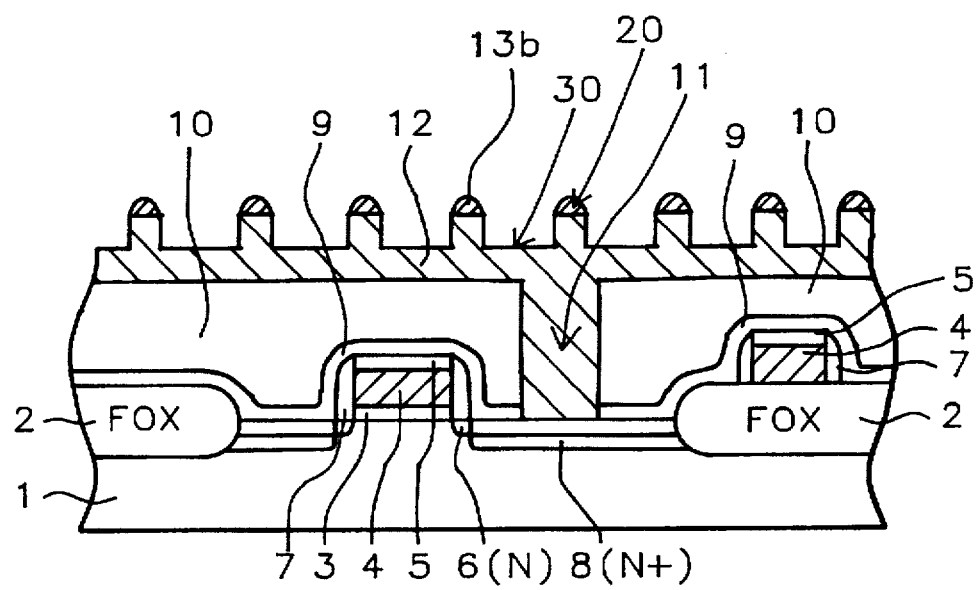

A critical reactive ion etching, (RIE), procedure is next performed using $SF_6$ as an etchant. The etch rate of heavily doped, second polysilicon layer, 12, is between about 1.2 to 1.5 times greater then the removal rate of intrinsic, HSG polysilicon spots, 13a. Therefore a blanket RIE step, not requiring photolithographic patterning, is performed removing between about 500 to 2000 Angstroms, of heavily doped, second polysilicon layer, 12, exposed between intrinsic, HSG polysilicon spots, 13a. During the blanket RIE procedure, using $SF_6$, as the etchant, between about 100 to 500 Angstroms of intrinsic, HSG polysilicon spots, 13a, are removed, still leaving between about 100 to 500 Angstroms of thinned, intrinsic, HSG polysilicon spots, 13b, overlying protected regions of heavily doped, second polysilicon layer, 12. This is schematically shown in FIG. 3. The resulting saw-toothed topography of heavily doped, second polysilicon layer, 12, is comprised of lower features, with surface, 30, and raised features, areas protected by intrinsic, HSG polysilicon spots, 13a, and now covered with thinned, intrinsic, HSG polysilicon spots, 13b, on surface, 20. The difference in height between the raised and lower features, is the amount of heavily doped, second polysilicon layer, 12, removed during the critical RIE procedure, and the thickness of thinned, intrinsic HSG polysilicon spots, 13b. The increase in surface area, achieved using the saw-toothed topography is also increased by the thickness of thinned, intrinsic, HSG polysilicon spots, remaining on surface, 20, of the raised feature, after the RIE procedure.

Figure 4:
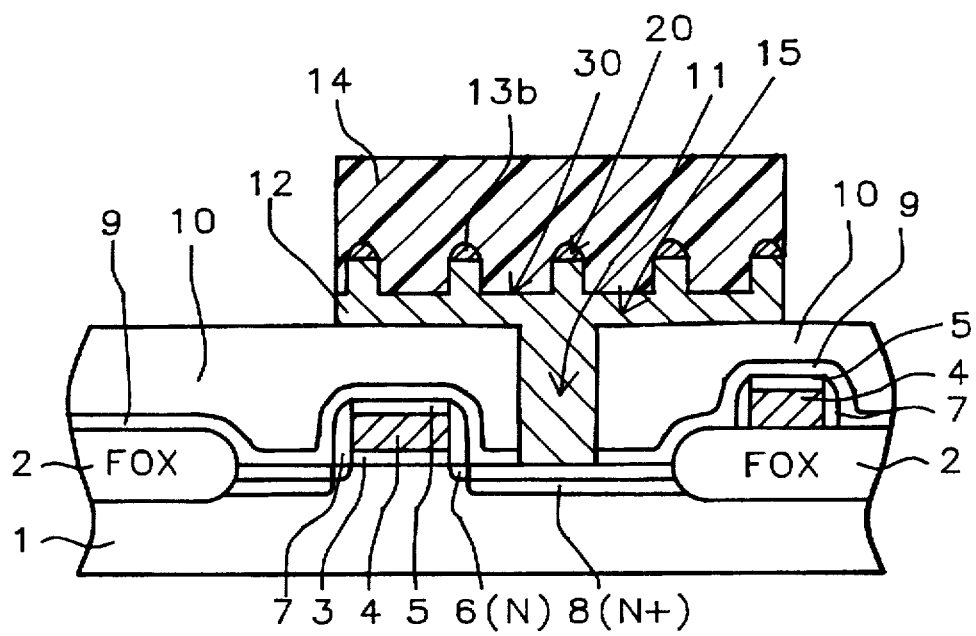

FIG. 4, schematically shows the patterning of heavily doped, second polysilicon layer, 12, comprised of a saw-toothed topography, with thinned, intrinsic HSG polysilicon spots, residing on surface, 20, of the raised features. Photoresist shape, 14, is used as a mask, during a RIE procedure, using $Cl_2$ as an etchant, defining polysilicon storage node electrode, 15. Polysilicon storage node electrode, 15, offers increased surface area, obtained via use of the saw-toothed topography. Removal of photoresist shape, 14, is accomplished via plasma oxygen ashing, and careful wet cleans.

Figure 5:
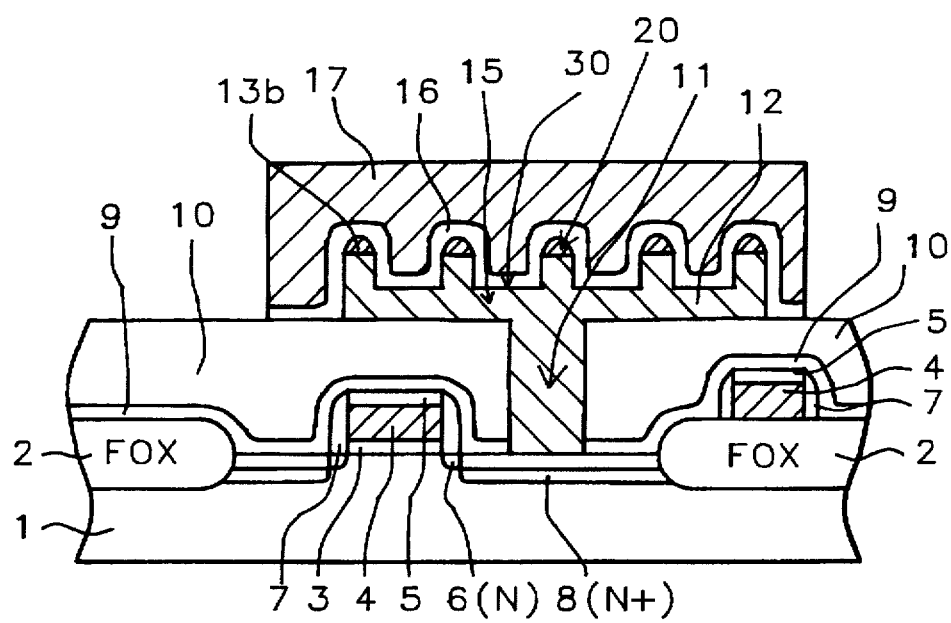

FIG. 5, schematically shows the completion of the STC structure. First a dielectric layer, 16, is formed, overlying the polysilicon storage node electrode, 15. Dielectric layer, 16, can be an insulator layer possessing a high dielectric constant, such as $Ta_2O_5$, obtained via r.f sputtering techniques, at a thickness between about 10 to 100 Angstroms. Dielectric layer, 16, can also be ONO, (Oxidized - silicon Nitride - silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via an situ doping deposition procedure, by the addition of phosphine, to the silane ambient. Photolithographic and RIE procedures, using $Cl_2$ as an etchant, are next employed to create polysilicon upper electrode, or plate electrode, 17, shown schematically in FIG. 5. Photoresist is again removed via plasma oxygen ashing and careful wet cleans, resulting in STC structure, 18, featuring increased surface area of polysilicon storage node electrode, 15.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first insulator layer, and from a first polysilicon layer, insulator sidewall spacers, formed from a second insulator layer, and source and drain regions, and an overlying STC structure; with a polysilicon storage node electrode, a dielectric layer, and an overlying polysilicon plate electrode, and with the top surface of said polysilicon storage node electrode, exhibiting a saw-toothed topography, comprising the steps of:

depositing a third insulator layer, on said underlying transistor of said DRAM device;

depositing a doped dielectric layer on said third insulator layer;

planarizing said doped dielectric layer;

opening a contact hole, in said doped dielectric layer, and in said third insulator layer, to expose top surface of said source and drain regions, of said underlying transistor;

depositing a doped, second polysilicon layer on top surface of said doped dielectric layer, and on top surface of said source and drain regions, exposed in said contact hole;

depositing intrinsic HSG polysilicon spots on said doped second polysilicon layer;

anisotropic etching of said intrinsic HSG polysilicon spots, resulting in thinned, intrinsic HSG polysilicon spots, overlying a region of unetched, said doped second polysilicon layer, and anisotropic etching of a top portion of said doped second polysilicon layer, exposed between said intrinsic HSG polysilicon spots, revealing a bottom portion of said doped second polysilicon layer, and forming said saw-toothed topography, for the top surface of said doped second polysilicon layer, comprised of raised features of said thinned, intrinsic HSG polysilicon spots, on unetched regions of said doped second polysilicon layer, and comprised of lower features of said bottom portion of said doped second polysilicon layer, located between said raised features;

patterning of said doped second polysilicon layer, to create said polysilicon storage node electrode, with said saw-toothed topography;

forming said dielectric layer on said polysilicon storage node electrode;

depositing a third polysilicon layer on said dielectric layer; and patterning of said third polysilicon layer to form said plate electrode, of said STC structure.

2. The method of claim 1, wherein said doped second polysilicon layer is deposited using LPCVD procedures, at a temperature between about 500° to 700° C., to a thickness between about 4000 to 8000 Angstroms, with a N type dopant concentration between about 1E20 to 1E21 atoms/$cm^3$, obtained using in situ doping procedures, via the addition of phosphine or arsine to a silane ambient.

3. The method of claim 1, wherein said intrinsic HSG polysilicon spots are deposited at a temperature between about 500° to 700° C., to a thickness between about 100 to 1000 Angstroms, with a diameter between about 50 to 500 Angstroms.

4. The method of claim 1, wherein the space between said intrinsic HSG polysilicon spots is between about 100 to 1000 Angstroms.

5. The method of claim 1, wherein said anisotropic etching of said intrinsic HSG polysilicon spots is performed via RIE, using $SF_6$ as an etchant, removing between about 100 to 500 Angstroms of said intrinsic HSG polysilicon spots, creating said thinned, intrinsic HSG polysilicon spots, between about 100 to 500 Angstroms, in thickness.

6. The method of claim 1, wherein said anisotropic etching of said top portion of said doped second polysilicon layer is performed via RIE, using SF, as an etchant, removing between about 500 to 2000 Angstroms of said doped second polysilicon layer, exposing said bottom portion of said doped second polysilicon layer.

7. The method of claim 1, wherein said saw-toothed topography, of said doped second polysilicon layer, is comprised of raised features of said thinned, intrinsic HSG polysilicon spots on regions of unetched, said doped second polysilicon layer, and lower features comprised of said bottom portion, of said doped second polysilicon layer, located between said raised features, with the difference in height between said raised features, and said lower features, between about 600 to 2500 Angstroms.

8. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

9. The method of claim 1, wherein said third polysilicon layer, used for creation of said polysilicon plate electrode of said STC structure, is deposited using LPCVD procedures, at a temperature between about 500° to 700° C., to a thickness between about 1000 to 2000 Angstroms.

10. A method of fabricating a stacked capacitor structure, (STC), for a DRAM device, in which the surface area of the polysilicon storage node electrode is increased via use of a polysilicon storage node electrode, exhibiting a top surface with a saw-tooth topography, obtained via a RIE process furnishing a faster removal rate for exposed doped polysilicon regions, then for masking intrinsic, HSG polysilicon spots, comprising the steps of:

depositing a first insulator layer on an underlying transistor structure, of said DRAM device;

depositing a doped dielectric layer on said first insulator layer;

planarizing said doped dielectric layer;

opening a contact hole in said doped dielectric layer, and in said first insulator layer, to expose top surface of said underlying transistor region;

depositing a doped, first polysilicon layer on top surface of said doped dielectric layer, and on said top surface of said underlying transistor region, exposed in said contact hole;

depositing intrinsic HSG polysilicon spots on said doped, first polysilicon layer;

anisotropic RIE of said intrinsic HSG polysilicon spots, resulting in thinned intrinsic HSG polysilicon spots, overlying a region of unetched, said doped second polysilicon layer, and anisotropic etching of a top portion of said doped second polysilicon layer, exposed between said intrinsic HSG polysilicon spots, revealing a bottom portion of said doped second polysilicon layer, and forming said saw-toothed topography, for the top surface of said doped second polysilicon layer, comprised of raised features of said thinned, intrinsic HSG polysilicon spots, overlying on unetched region of said doped second polysilicon layer, and comprised of lower features of said bottom portion of said doped polysilicon layer, located between said raised features;

patterning of said doped, first polysilicon layer to create said polysilicon storage node electrode, with said saw-toothed topography;

forming a dielectric layer on saw-toothed polysilicon storage node electrode;

depositing a second polysilicon layer on said dielectric layer; and patterning of said second polysilicon layer to form polysilicon plate electrode, of said STC structure.

11. The method of claim 10, wherein said doped, first polysilicon layer is obtained via LPCVD procedures, at a temperature between about 500° to 700° C., to a thickness between about 4000 to 8000 Angstroms, with an N type dopant concentration between about 1E20 to 1E21 atoms/$cm^3$, obtained using an in situ doping procedure via the addition of either phosphine or arsine to a silane ambient.

12. The method of claim 10, wherein said intrinsic HSG polysilicon spots are deposited at a temperature between about 500° to 700° C., to a thickness between about 100 to 1000 Angstroms, with a diameter between about 50 to 500 Angstroms.

13. The method of claim 10, wherein the space between said intrinsic HSG polysilicon spots is between about 100 to 1000 Angstroms.

14. The method of claim 10, wherein said anisotropic RIE of said intrinsic HSG polysilicon spots is performed using $SF_6$, as an etchant, removing between about 100 to 500 Angstroms of said intrinsic HSG polysilicon spots, creating said thinned, intrinsic HSG polysilicon spots, between about 100 to 500 Angstroms, in thickness.

15. The method of claim 10, wherein said anisotropic RIE of said top portion of said doped second polysilicon layer, is performed using $SF_6$ as an etchant, removing between about 500 to 2000 Angstroms of said doped second polysilicon layer, exposing said bottom portion of said doped second polysilicon layer.

16. The method of claim 10, wherein said saw-toothed topography, for the top surface of said doped second polysilicon layer, is comprised of raised features of said thinned, intrinsic HSG polysilicon spots, on unetched regions of said doped second polysilicon layer, and lower features, comprised of said bottom portions of said doped second polysilicon layer, located between said raised features, and with the difference in height between said raised features, and said lower features, between about 600 to 2500 Angstroms.

17. The method of claim 10, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

18. The method of claim 10, wherein said second polysilicon layer is deposited using LPCVD procedures, at a temperature between about 500° to 700° C., to a thickness between about 1000 to 2000 Angstroms.

19. The method of claim 10, wherein said polysilicon plate electrode is created via RIE of said second polysilicon layer, using $Cl_2$ as an etchant.

* * * * *